United States Patent
Tanaka et al.

(10) Patent No.: US 7,333,523 B2
(45) Date of Patent: Feb. 19, 2008

(54) SEMICONDUCTOR LASER DEVICE

(75) Inventors: Akira Tanaka, Kanagawa-ken (JP);
Hideto Sugawara, Kanagawa-ken (JP);
Chie Hongo, Kanagawa-ken (JP);
Yoshiyuki Harada, Tokyo (JP);
Masaaki Onomura, Tokyo (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 38 days.

(21) Appl. No.: 11/484,006

(22) Filed: Jul. 11, 2006

(65) Prior Publication Data

US 2007/0009000 A1 Jan. 11, 2007

(30) Foreign Application Priority Data

Jul. 11, 2005 (JP) ............................. 2005-201686

(51) Int. Cl.
*H01S 5/00* (2006.01)
(52) U.S. Cl. ................. 372/45.01; 372/45.012
(58) Field of Classification Search ........... 372/45.012, 372/50.11, 72
See application file for complete search history.

(56) References Cited

U.S. PATENT DOCUMENTS

| | | | |
|---|---|---|---|
| 5,309,466 A * | 5/1994 | Ueno et al. ............ 372/45.011 |
| 6,335,547 B1 | 1/2002 | Yoshinaga et al. | |
| 6,617,606 B2 | 9/2003 | Nakatsu et al. | |
| 6,630,692 B2 | 10/2003 | Goetz et al. | |
| 6,806,502 B2 | 10/2004 | Iyechika et al. | |
| 2002/0104996 A1* | 8/2002 | Kuo et al. ................... 257/79 |
| 2005/0040384 A1 | 2/2005 | Tanaka et al. | |
| 2005/0218415 A1* | 10/2005 | Tanaka et al. ................ 257/94 |

FOREIGN PATENT DOCUMENTS

| | | |
|---|---|---|
| JP | 2004-104157 | 4/2004 |
| JP | 2005-019874 | 1/2005 |

OTHER PUBLICATIONS

U.S. Appl. No. 11/347,658, filed Feb. 6, 2006.
U.S. Appl. No. 11/357,408, filed Feb. 21, 2006.

* cited by examiner

*Primary Examiner*—Minsun Oh Harvey
*Assistant Examiner*—Tuan N. Nguyen
(74) *Attorney, Agent, or Firm*—Banner & Witcoff, Ltd

(57) ABSTRACT

A semiconductor laser device comprising: a first cladding layer of a first conductivity type; an active layer provided on the first cladding layer and having a quantum well structure; an overflow blocking layer of a second conductivity type provided on the overflow blocking layer. The active layer includes a region having an impurity concentration is $3 \times 10^{17}$ $cm^{-3}$ or more and having a thickness of 30 nm or less between the overflow blocking layer and a well layer in the active layer closet to the overflow blocking layer.

19 Claims, 12 Drawing Sheets

SEMICONDUCTOR LASER DEVICE

CROSS-REFERENCE TO RELATED APPLICATIONS

This application is based upon and claims the benefit of priority from the prior Japanese Patent Application No. 2005-201686, filed on Jul. 11, 2005; the entire contents of which are incorporated herein by reference.

BACKGROUND OF THE INVENTION

The development of the next-generation DVD (Digital Versatile Disc) has been in progress for the long-term recording of high-definition videos and for computer mass storage. In order to achieve a recording capacity four times or more than that of conventional DVDs, the wavelength of the semiconductor laser device must be in the 400 nm band rather than in the conventional 650 nm band. To this end, gallium nitride based materials are used.

The ridge waveguide structure is often used in both InGaAlP-based semiconductor laser devices in the 650 nm band and InGaAlN-based semiconductor laser devices in the 400 nm band. In this structure, a ridge portion to serve as a waveguide is formed in a cladding layer that is provided above the double heterojunction including an active layer, thereby confining horizontal transverse modes.

The next-generation DVD requires a gallium nitride based semiconductor laser device, which provides a high power for mass storage. In general, in gallium nitride based materials, magnesium (Mg) is used as impurities for providing the p-type conductivity. However, Mg is likely to form deep levels in gallium nitride based materials. Such deep levels formed in the vicinity of the active layer will promote non-emissive recombination between electrons and holes (JP 2002-111053A and its corresponding U.S. Pat. No. 6,617,606). This results in decreasing the emission efficiency of the semiconductor laser device and makes it difficult to meet the requirements for the next-generation DVD, which requires an optical power of 100 mW or more.

SUMMARY OF THE INVENTION

According to an aspect of the invention, there is provided a semiconductor laser device comprising: a first cladding layer of a first conductivity type; an active layer provided on the first cladding layer and having a quantum well structure; an overflow blocking layer of a second conductivity type provided on the active layer; and a second cladding layer of the second conductivity type provided on the overflow blocking layer, the active layer including a region having an impurity concentration of $3\times10^{17}$ cm$^{-3}$ or more between the overflow blocking layer and a well layer in the active layer closest to the overflow blocking layer, and the region having a thickness of 30 nanometers or less.

According to other aspect of the invention, there is provided a semiconductor laser device comprising: a first cladding layer of a first conductivity type; an active layer provided on the first cladding layer, the active layer having a single quantum well structure or a multiple quantum well structure of $In_xGa_{1-x}N$ ($0.05 \leq x \leq 1$) and $In_yGa_{1-y}N$ ($0 \leq y \leq 1$, $x > y$); an overflow blocking layer of a second conductivity type provided on the active layer, the over flow blocking layer being made of an $Al_tGa_{1-t}N$ ($0 < t \leq 1$) layer; and a second cladding layer of the second conductivity type provided on the over flow blocking layer, the first cladding layer including a superlattice lamination of $Al_sGa_{1-s}N$ ($0 < s \leq 0.3$, $t > s$) and GaN layer, or an $Al_sGa_{1-s}N$ ($0 < s \leq 0.3$, $t > s$) layer, the second cladding layer including a superlattice lamination of $Al_uGa_{1-u}N$ ($0 < u \leq 0.3$, $t > u$) and GaN layer, or an $Al_uGa_{1-u}N$ ($0 < u \leq 0.3$, $t > u$) layer, and the active layer including a region having an impurity concentration of $3\times10^{17}$ cm$^{-3}$ or more and having a thickness of 30 nm or less between the overflow blocking layer and a well layer in the active layer closest to the overflow blocking layer.

According to other aspect of the invention, there is provided a semiconductor laser device comprising: a first cladding layer of a first conductivity type; an active layer provided on the first cladding layer, the active layer having a single quantum well structure or a multiple quantum well structure of InxGa1-xN ($0.05 \leq x1$) and InyGa1-yN ($0 \leq y \leq 1, x > y$); an overflow blocking layer of a second conductivity type provided on the active layer, the overflow blocking layer being made of an AltGa1-tN ($0 < t \leq 1$) layer; and a second cladding layer of a second conductivity type provided on the overflow blocking layer, the second cladding layer having a ridge portion constituting a striped waveguide and non-ridge portions adjacent to both sides of the ridge portion, the first cladding layer including a superlattice lamination of AlsGa1-sN ($0 < s \leq 0.3$, $t > s$) and GaN layer, or an AlsGa1-sN ($0 < s \leq 0.3$, $t > s$) layer, and the second cladding layer including a superlattice lamination of AluGa1-uN ($0 < u \leq 0.3$, $t > u$) and GaN layer, or an AluGa1-uN ($0 < u \leq 0.3$, $t > u$) layer, and the active layer including a region having an impurity concentration is $3\times10^{17}$ cm$^{-3}$ or more and having a thickness of 30 nm or less between the overflow blocking layer and a well layer in the active layer closest to the overflow blocking layer.

DETAILED DESCRIPTION OF THE INVENTION

Embodiments of the invention will now be described with reference to the drawings.

Figure 1:
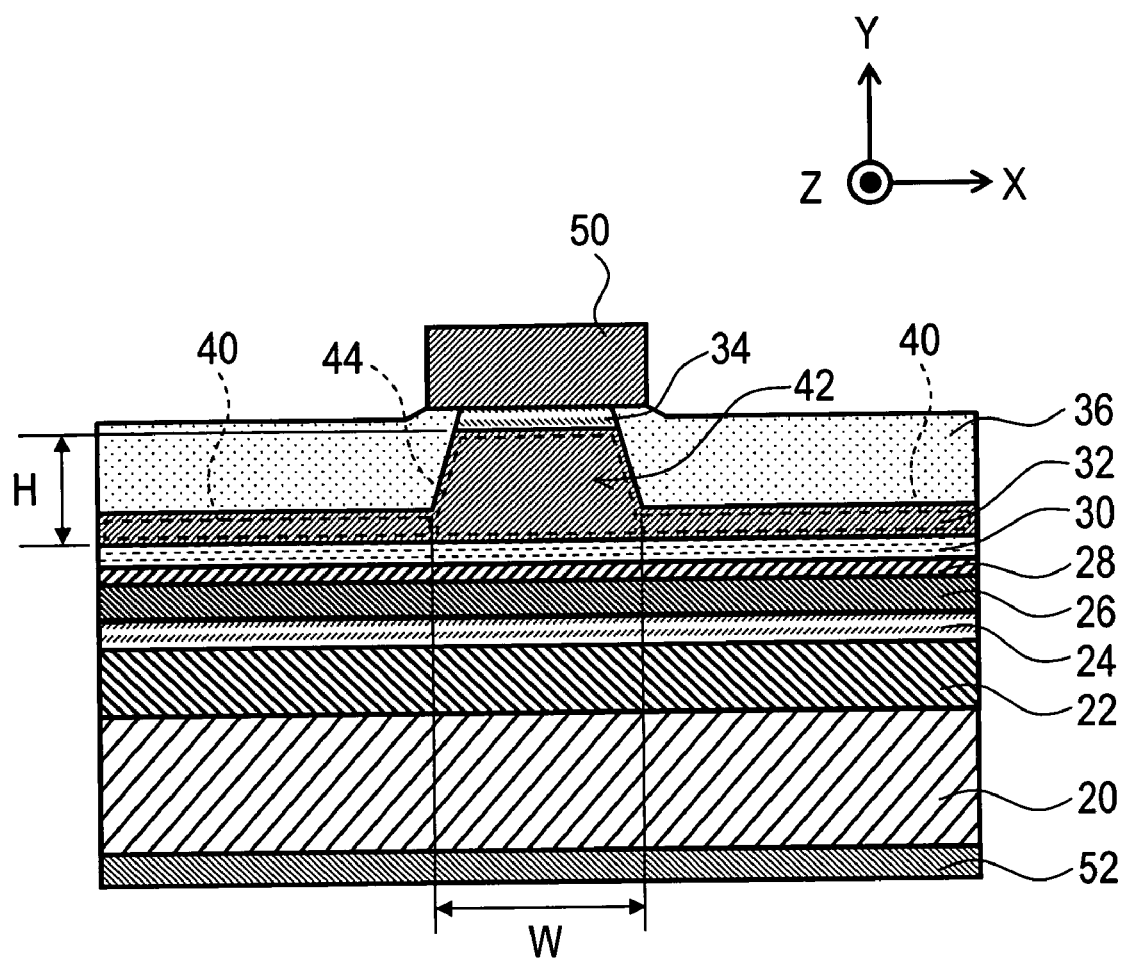
FIG. 1 is a schematic cross section of a semiconductor laser device according to an embodiment of the invention.

FIG. 1 is a schematic cross section of a semiconductor laser device according to an embodiment of the invention.

On an n-type GaN substrate 20, an n-type $Al_{0.08}Ga_{0.92}N$ cladding layer 22 (with a thickness of 0.5 to 2.0 μm), an n-type GaN optical guide layer 24 (with a thickness of 0.01 to 0.1 μm), and an $In_{0.15}Ga_{0.85}N/In_{0.02}Ga_{0.98}N$ QW (Quantum Well) active layer 26 are grown.

On the active layer 26, a $p^+$-type $Al_{0.2}Ga_{0.8}N$ overflow blocking layer 28 (with a thickness of 5 to 20 nm), a p-type GaN optical guide layer 30 (with a thickness of 0.01 to 0.1 μm), a p-type $Al_{0.08}Ga_{0.92}N$ cladding layer 32 (with a thickness of 0.5 to 2.0 μm), and a $p^+$-type GaN contact layer (with a thickness of 0.02 to 0.2 μm) are sequentially grown.

These semiconductor laminated films can be grown by the MOCVD (Metal Organic Chemical Vapor Deposition) method, for example. Si is used as n-type impurities, and Mg is used as p-type impurities.

The "gallium nitride based semiconductor" used herein includes semiconductors having any composition represented by the chemical formula $In_xAl_yGa_{1-x-y}N$ ($0 \leq x \leq 1$, $0 \leq y \leq 1$, $x+y \leq 1$) where the composition ratios x and y are varied in the respective ranges.

The structure illustrated in FIG. 1 belongs to the refractive index waveguide structure also referred to as the ridge waveguide structure. More specifically, the p-type AlGaN cladding layer 32 has a ridge portion 42 (represented by dashed line) and a non-ridge portion 40 (represented by dashed line). The $p^+$-type GaN contact layer 34 above the ridge portion 42 is also patterned. An insulating film 36 is formed on the $p^+$-type GaN contact layer 34 side face and a ridge side face 44 of the ridge portion 42, which have been patterned. The insulating film 36 can be made of materials such as silicon oxide film ($SiO_2$) or silicon nitride film ($Si_3N_4$).

The $p^+$-type GaN contact layer 34 is connected to a p-side electrode 50 made of monolayer, lamination, or alloy of Pt, Pd, Ni, and Au, for example. The n-type GaN substrate 20 is connected to an n-side electrode 52, which is made of monolayer, lamination, or alloy of Ti, Pt, Au, Al, and the like.

Since the insulating film 36 is provided on the ridge side face 44 of the ridge portion 42, a difference of refractive index occurs between the p-type AlGaN cladding layer 32 constituting the ridge portion 42 and the insulating film 36. Since the ridge portion 42 has a higher refractive index than the insulating film 36, the fundamental horizontal transverse mode is confined horizontally (X axis) relative to the active layer 26 in the cross section orthogonal to the optical axis (parallel to the Z axis). In this example, the width W of the ridge portion 42 is set to 1 to 3 μm, thereby suppressing higher order modes.

Next, the function of the laminated structure will be described in more detail.

Figure 2:
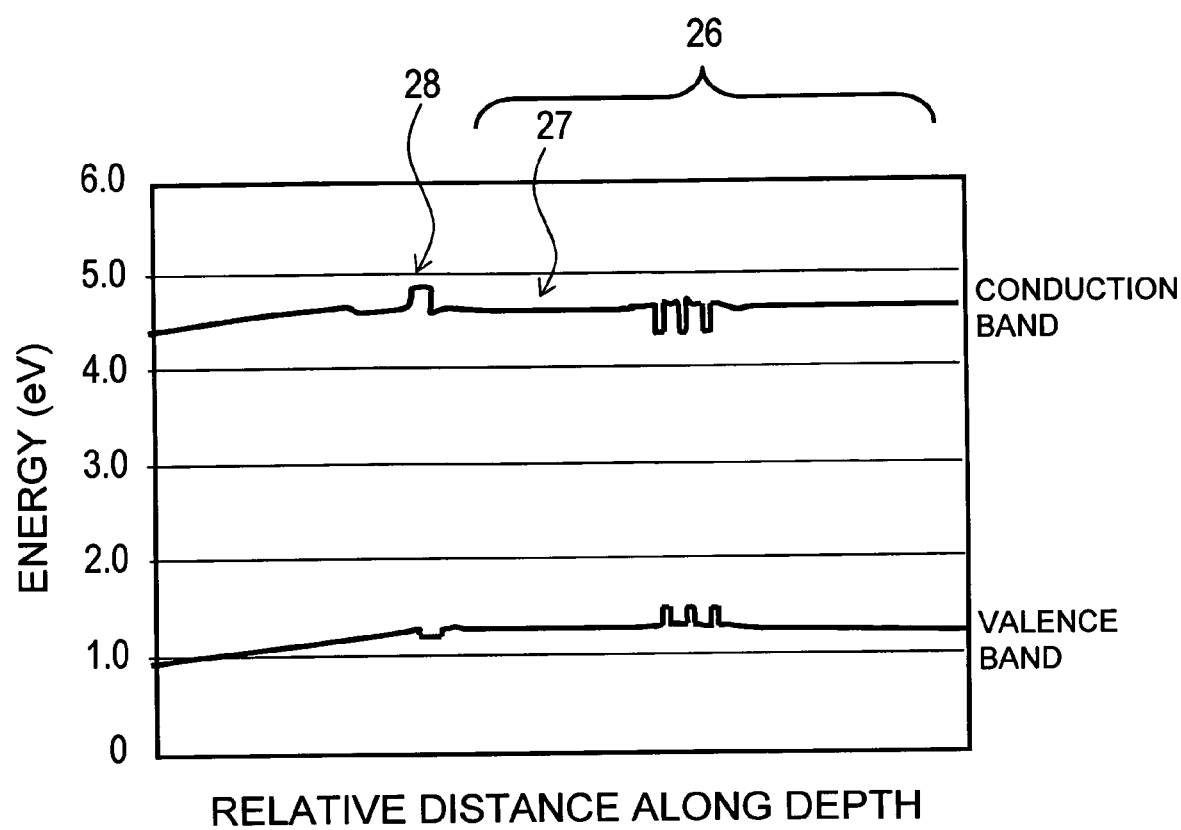
FIG. 2 is a schematic diagram showing the bandgap energy in the vicinity of the active layer in the semiconductor laser device according to the example of the invention.

FIG. 2 is a schematic diagram showing the approximate bandgap energy at the positions of the active layer 26, the $p^+$-type overflow blocking layer 28, and an upper barrier layer 27 in this example. The barrier layer 27 has a wide bandgap energy of about 3.2 eV because the gallium nitride based semiconductor is used.

Figure 3:
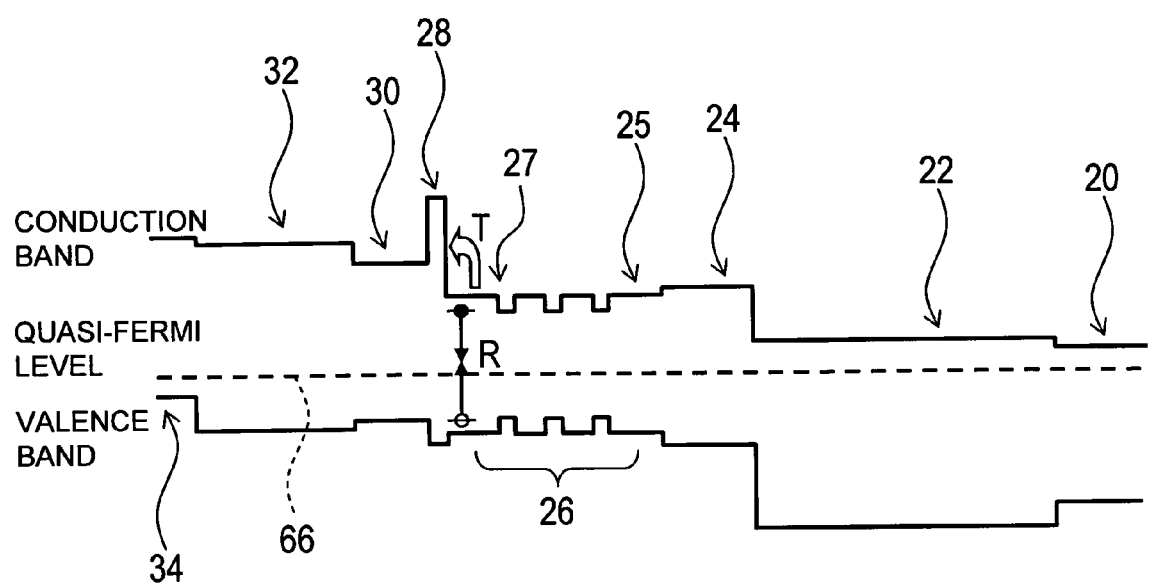
FIG. 3 is a band diagram of the semiconductor laser device according to the example of the invention.

FIG. 3 is a band diagram showing the more detailed configuration of the laminated structure.

The $p^+$-type overflow blocking layer 28 can suppress unnecessary increase of operating current due to leakage of electrons T, injected from the n-type GaN substrate 20 side, into the p-type $Al_xGa_{1-x}N$ cladding layer 32, as indicated by the arrow. The dashed line represents the quasi-Fermi level 66.

More specifically, a higher aluminum (Al) composition ratio t of the $p^+$-type $Al_tGa_{1-t}N$ overflow blocking layer 28 increases its band gap difference relative to the active layer 26, which can block electrons T injected from the n-side from leaking from the active layer 26 into the p-type AlGaN cladding layer 32. Moreover, since the heterobarrier on the conduction band side relative to the active layer 26 can be increased by increasing the p-type concentration of the $p^+$-type AlGaN overflow blocking layer 28, the leakage of electrons T can be further reduced.

Next, an additional explanation is given of the components of the laminated structure. The p-type cladding layer 32 and the n-type cladding layer 22 are not limited to the composition of $Al_{0.08}Ga_{0.92}N$ and the above-described thickness. For example, the Al composition ratio of the $Al_sGa_{1-s}N$ layer can be varied in the range of $0 < s \leq 0.3$. Alternatively, $Al_sGa_{1-s}N$ ($0 < s \leq 0.3$) and GaN layers with a thickness of 1 to 5 nm can be alternately laminated to form a superlattice layer. In this case, the Al composition ratio can be set to 0.16, for example. The superlattice layer can relieve stress due to lattice mismatch (that is, it is effective in preventing cracks) and can reduce the operating voltage. The Al composition ratio of the $p^+$-type overflow blocking layer 28 is not limited to 0.2, but can be selected in the composition range of $Al_tGa_{1-t}N$ ($1.0 \geq t > s$).

The active layer 26 is not limited to a single quantum well. It may have a MQW (Multiple Quantum Well) structure composed of $In_xGa_{1-x}N$ ($0.05 \leq x \leq 1.0$) and $In_yGa_{1-y}N$ ($0 \leq y \leq 1.0$, $x > y$).

Figure 4:
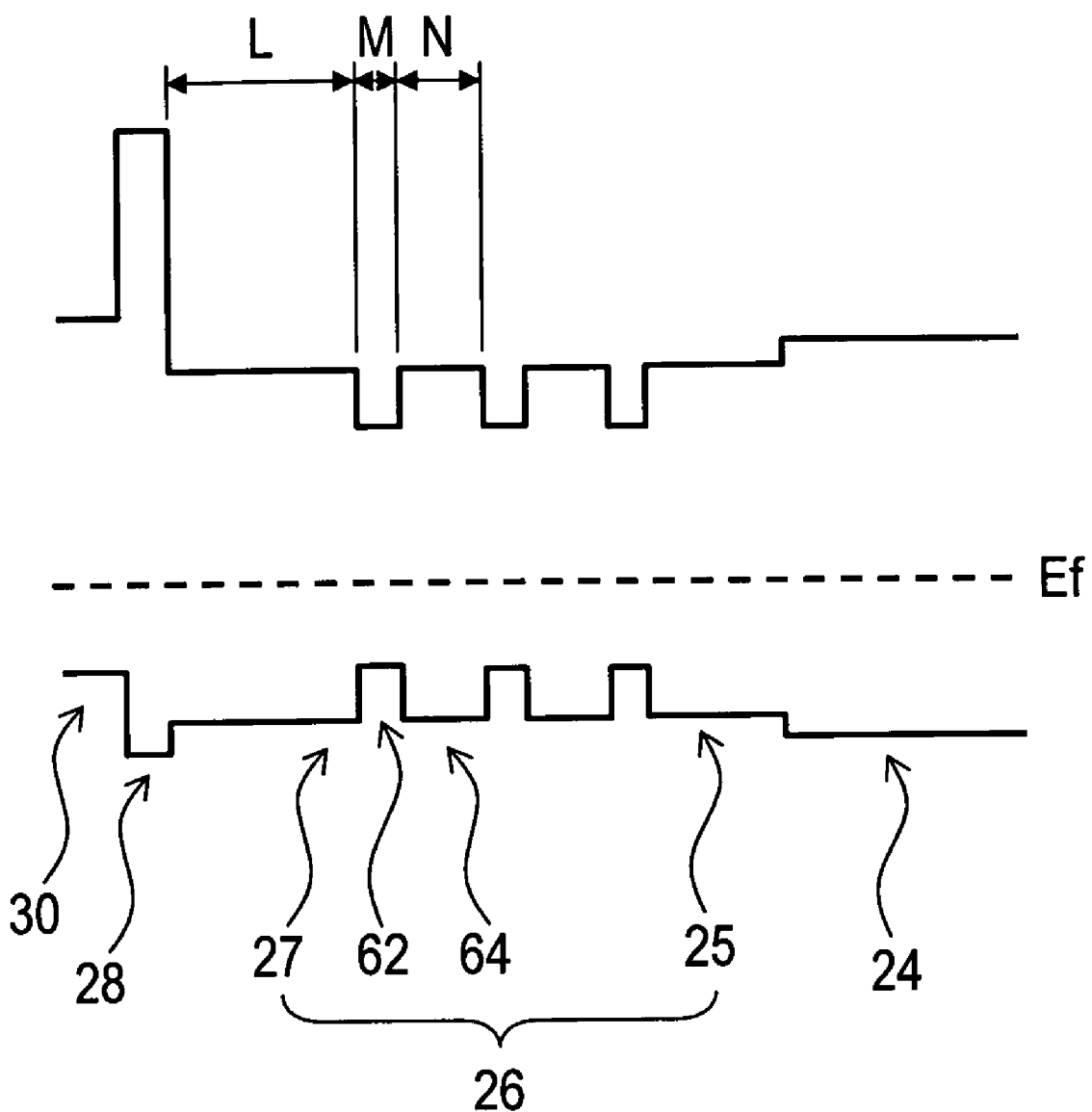
FIG. 4 is a band diagram in the vicinity of the quantum well structure in the semiconductor laser device according to the example of the invention.

FIG. 4 is a band diagram in the vicinity of the MQW structure in this example.

The active layer 26, which is an InGaN/InGaN MQW, has well layers 62 (having three layers in FIG. 4), barrier layers 64 (having two layers in FIG. 4), a lower barrier layer 25, and an upper barrier layer 27. For example, the structure of $In_{0.15}Ga_{0.85}N/In_{0.02}Ga_{0.98}N$ can be used, where the well thickness M is 2 to 5 nm, the number of wells is 2 to 4, and the barrier thickness N is 3 to 10 nm. The individual thickness of the upper barrier layer 27 and the lower barrier layer 25 is preferably selected in the range of 20 to 100 nm.

Next, an explanation is given of the decrease of emission efficiency due to non-emissive recombination that may occur in the vicinity of the active layer 26, particularly in the upper barrier layer 27 which is part of the active layer 26.

Figure 5:
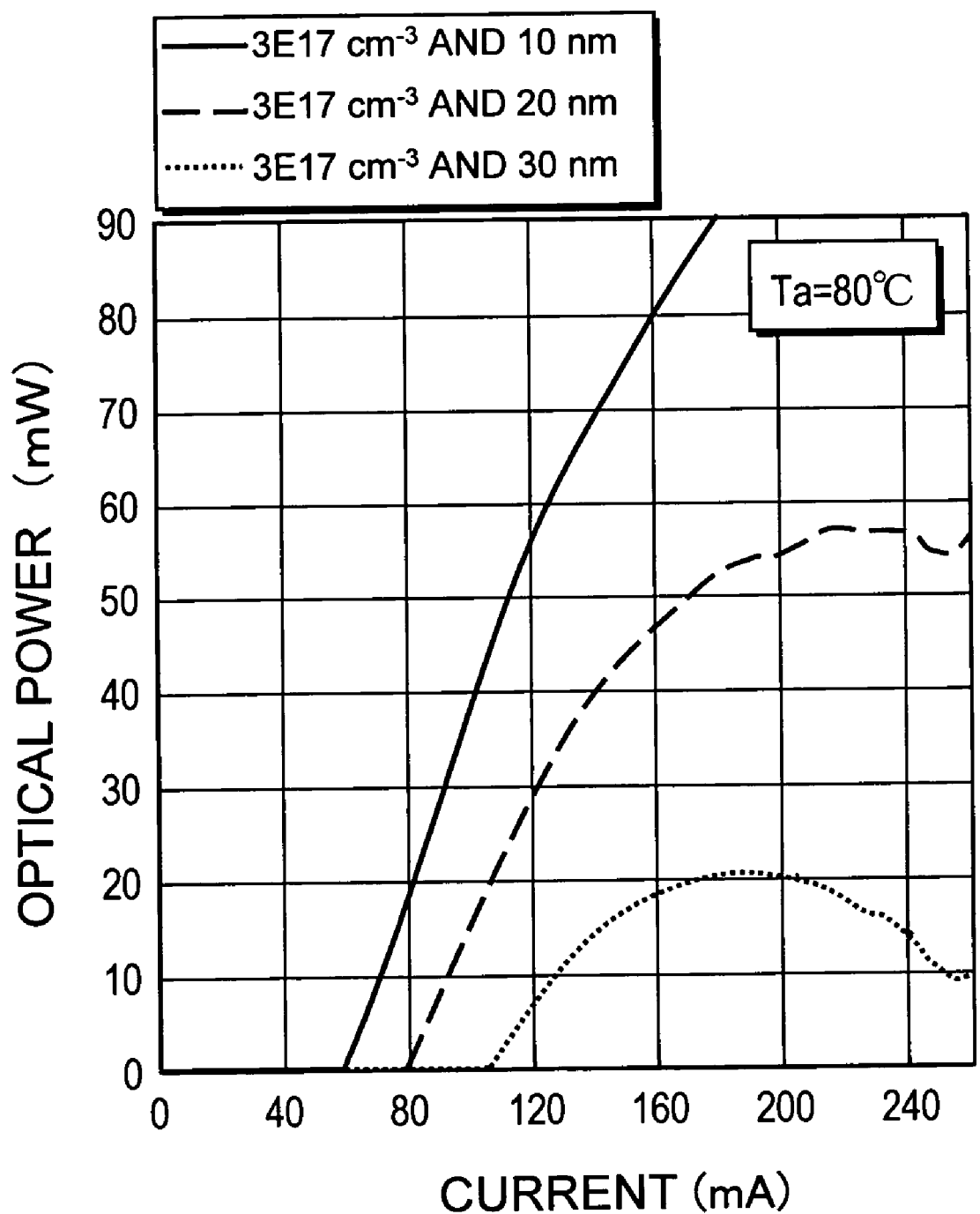
FIGS. 5 and 6 are graphical diagrams showing the simulation result for the optical power versus current characteristics of the semiconductor laser device according to the example of the invention.

FIG. 5 is a graphical diagram of the simulation result showing a relationship between the optical power and current characteristics obtained when a p-type region occurs inside the upper barrier layer 27. Here, the ambient temperature is 80 degrees centigrade.

The optical power versus current characteristics are shown for the cases where the p-type region having an impurity concentration of $3 \times 10^{17}$ $cm^{-3}$ has a thickness of 10, 20, and 30 nm, respectively, inside the upper barrier layer 27, which has thickness L between the $p^+$-type AlGaN overflow blocking layer 28 and the closest well layer.

As the width of the impurity region having a concentration of $3 \times 10^{17}$ $cm^{-3}$ is smaller and smaller, the optical power is higher, that is, the emission efficiency is higher. When the thickness of the impurity region having a concentration of $3 \times 10^{17}$ $cm^{-3}$ or more is 30 nm or more, the optical power is 20 mW or less, which is insufficient for rewriting, and even reproducing applications for the next-generation DVDs.

Figure 6:
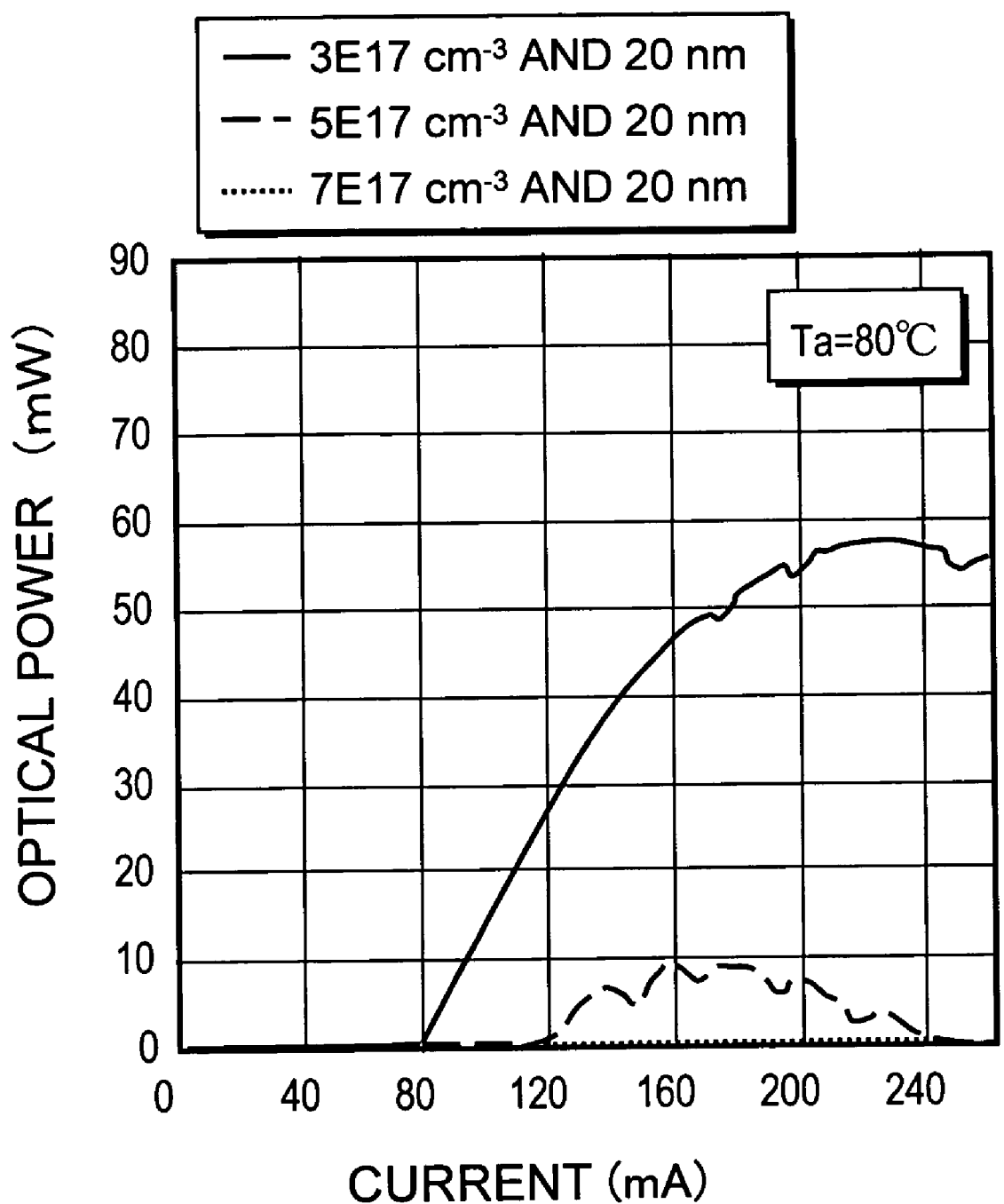

FIG. 6 is a graphical diagram of the simulation result showing the optical power versus current characteristics obtained when the impurity concentration is $3\times10^{17}$ cm$^{-3}$, $5\times10^{17}$ cm$^{-3}$, and $7\times10^{17}$ cm$^{-3}$, respectively, and the region thickness is all 20 nm (the ambient temperature is 80 degrees centigrade).

For an impurity concentration of $5\times10^{17}$ cm$^{-3}$ and a region thickness of 20 nm, the optical power decreases to 10 mW. This characteristic is insufficient for rewriting, and even reproducing applications for the next-generation DVDs.

Additionally, the following is the data assumed in this simulation. The lower barrier layer 25 is $In_{0.02}Ga_{0.98}N$ (with a thickness of 20 nm), the well layer is $In_{0.15}Ga_{0.85}N$ (with a thickness of 3 nm, three layers), the barrier layer is $In_{0.02}Ga_{0.98}N$ (with a thickness of 10 nm, two layers), the upper barrier layer 27 is $In_{0.02}Ga_{0.98}N$ (with a thickness of 100 nm), the p$^+$-type overflow blocking layer 28 is $Al_{0.2}Ga_{0.8}N$ (with a thickness of 10 nm), and the p-type cladding layer 32 is $Al_{0.08}Ga_{0.92}N$ (with a thickness of 0.6 µm).

The cause of the decrease of optical power as illustrated in FIGS. 5 and 6 is now considered. The p$^+$-type overflow blocking layer 28 is doped with p-type impurities such as Mg at high concentrations. Depending on the doping timing in crystal growth, and because of impurity diffusion due to temperature increase in the subsequent processes, the upper barrier layer 27 may also be doped with p-type impurities.

The upper barrier layer 27 is excessive in electrons due to current injection. Therefore, a deep level that may arise from impurities in the upper barrier layer 27 causes a non-emissive recombination R between an electron and a hole as illustrated by the arrow in FIG. 3. Non-emissive recombination R are likely to occur in gallium nitride based materials because they have deep levels particularly due to Mg. Such non-emissive recombination R result in ineffective current that does not contribute to light emission. Because the above simulation takes the non-emissive recombination phenomenon into consideration, it can well explain the phenomenon in which the highly concentrated p-type region in the upper barrier layer decreases the emission efficiency.

It can be understood from the foregoing results that in this example, in the upper barrier layer 27 having thickness L, the thickness of the region having an impurity concentration of $3\times10^{17}$ cm$^{-3}$ or more is preferably 30 nm or less. In the following, it is further described with reference to profile measurements.

Figure 7:
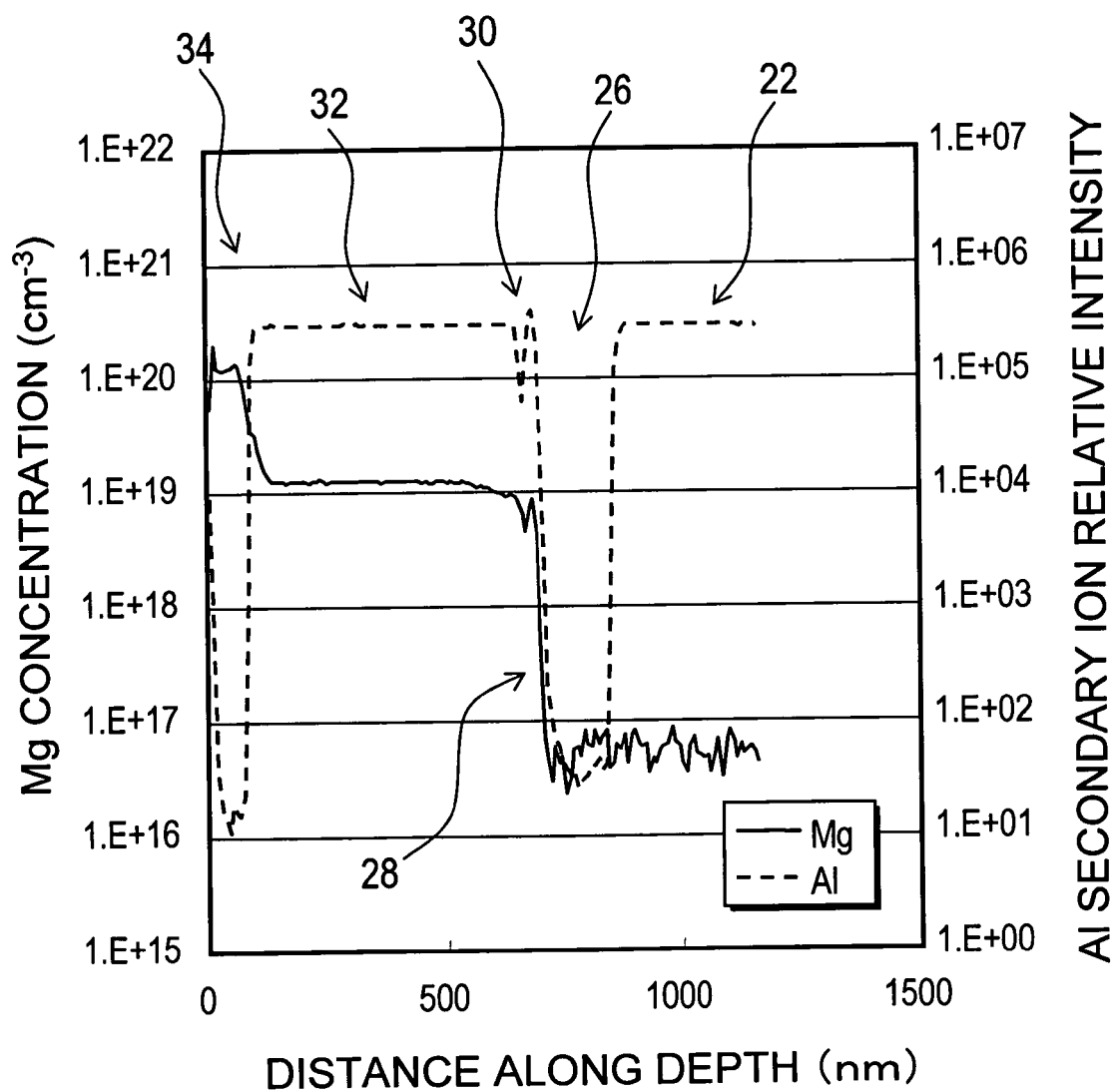
FIG. 7 shows the SIMS analysis data representing the profile of the semiconductor laser device according to the example of the invention.

FIG. 7 is a graphical diagram showing the Mg concentration and the Al secondary ion relative intensity analyzed by SIMS (Secondary Ion Mass Spectrometer) in this example. The horizontal axis represents the sputter depth in SIMS analysis, which corresponds to the distance along the depth (nm) with the surface being defined as zero. The Al secondary ion relative intensity indicated by the dashed line serves to monitor the laminated structure.

From the distribution of the Al secondary ion relative intensity indicated by the dashed line and the Mg concentration indicated by the solid line, it can be understood that the thickness H of the p-type cladding layer 32 (0.6 µm), the thickness of the p-type GaN optical guide layer 30 (30 nm), and the thickness of the p$^+$-type overflow blocking layer 28 (10 nm) are in good agreement with the simulation setting. Note that the effective acceptor concentration is lower than the Mg concentration because Mg is not completely activated.

Figure 8:
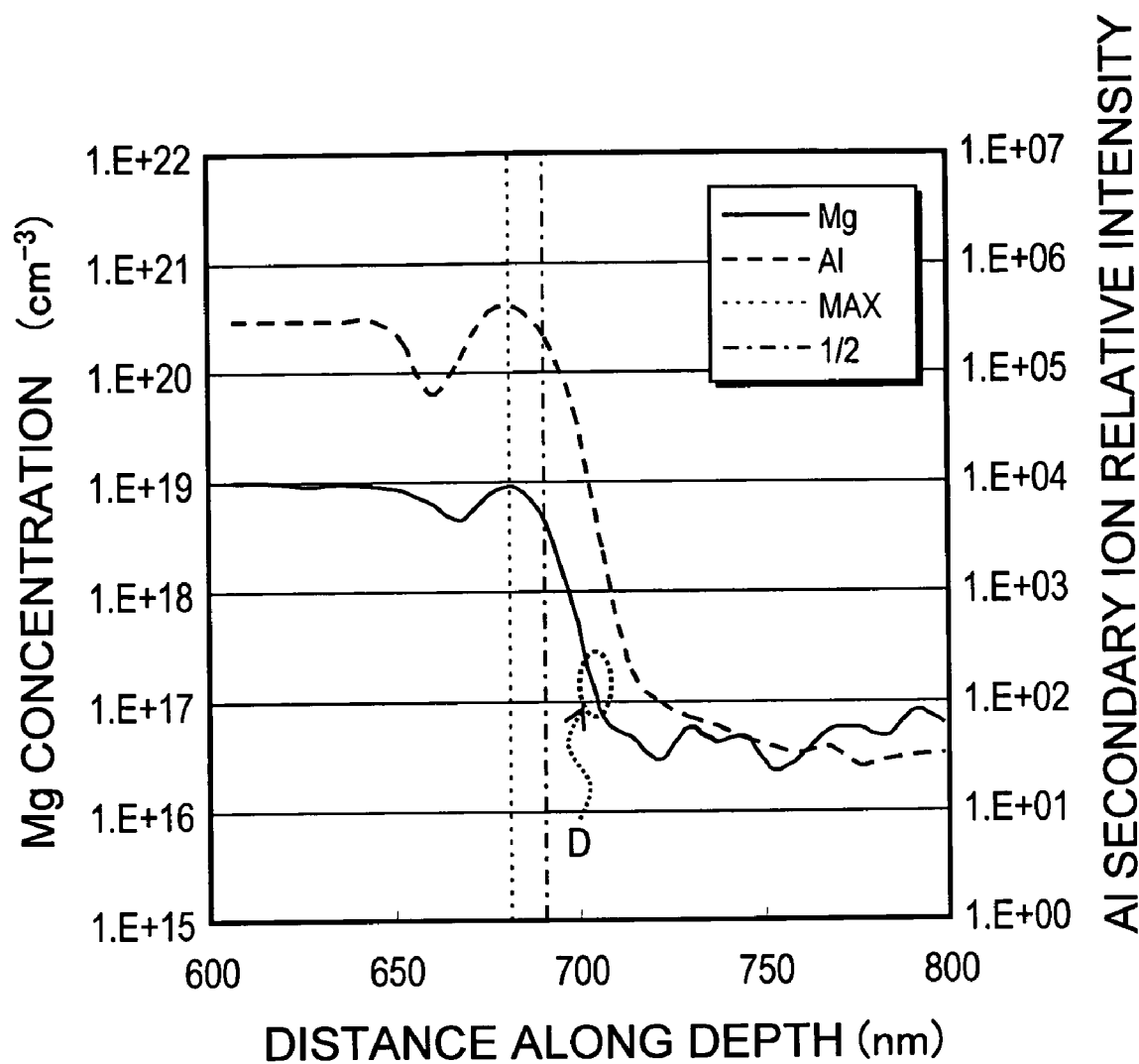
FIG. 8 shows the SIMS analysis data representing the magnesium concentration profile of the semiconductor laser device according to the example of the invention.

FIG. 8 is a graphical diagram that enlarges the interfacial region between the p$^+$-type AlGaN overflow blocking layer 28 and the active layer 26 in FIG. 7.

The information on the interface obtained by SIMS analysis may be made inaccurate due to the surface irregularities or the sputter condition of the analyzed sample, which makes the steepness evaluation difficult. The interface is defined herein as the position of half the maximum of the profile as often used in SIMS analysis.

In FIG. 8, if the interface between the p$^+$-type AlGaN overflow blocking layer 28 and the active layer 26 is defined as the position of half the maximum of the Al secondary ion profile, it is in good agreement with the position of half the maximum of the Mg profile. Therefore, this position can be regarded as the interface.

In actual crystal growth, typically, Mg leads to the "memory effect" to cause some "disagreement" between the doping timing and the profile of the grown film. In the present example, a delay in Mg doping in the p$^+$-type overflow blocking layer 28 produces a region that fails to reach the Mg concentration required for blocking electron overflow. To avoid this, the doping gas Cp$_2$Mg and the material gas are supplied at earlier appropriate timings, respectively, while the growth of the laminated film is continued. As a result, as illustrated in FIG. 8, the p$^+$-type overflow blocking layer 28 can be doped with Mg at a concentration of $9\times10^{18}$ cm$^{-3}$. In addition, FIG. 8 shows that Mg does not significantly diffuse at this interface.

However, upon a more detailed analysis, it can be understood that the Mg profile has a more gradual slope in the region away from the interface position and close to the active layer 26. This slope, which is more gradual than that of the Al secondary ion profile, indicates that Mg is diffused in this region. Presumably, this diffusion of Mg depends primarily on the doping concentration.

It can be understood from FIG. 8 that Mg diffusion at about $1\times10^{17}$ cm$^{-3}$ occurs within a region of 10 nm plus from the interface when the amount of Mg doping in the p$^+$-type AlGaN overflow blocking layer 28 is $9\times10^{18}$ cm$^{-3}$. It can also be understood that the Mg diffusion at about $3\times10^{17}$ cm$^{-3}$, which decreases the emission efficiency as revealed by the simulation, occurs within a region D of nearly 10 nm.

Figure 9:
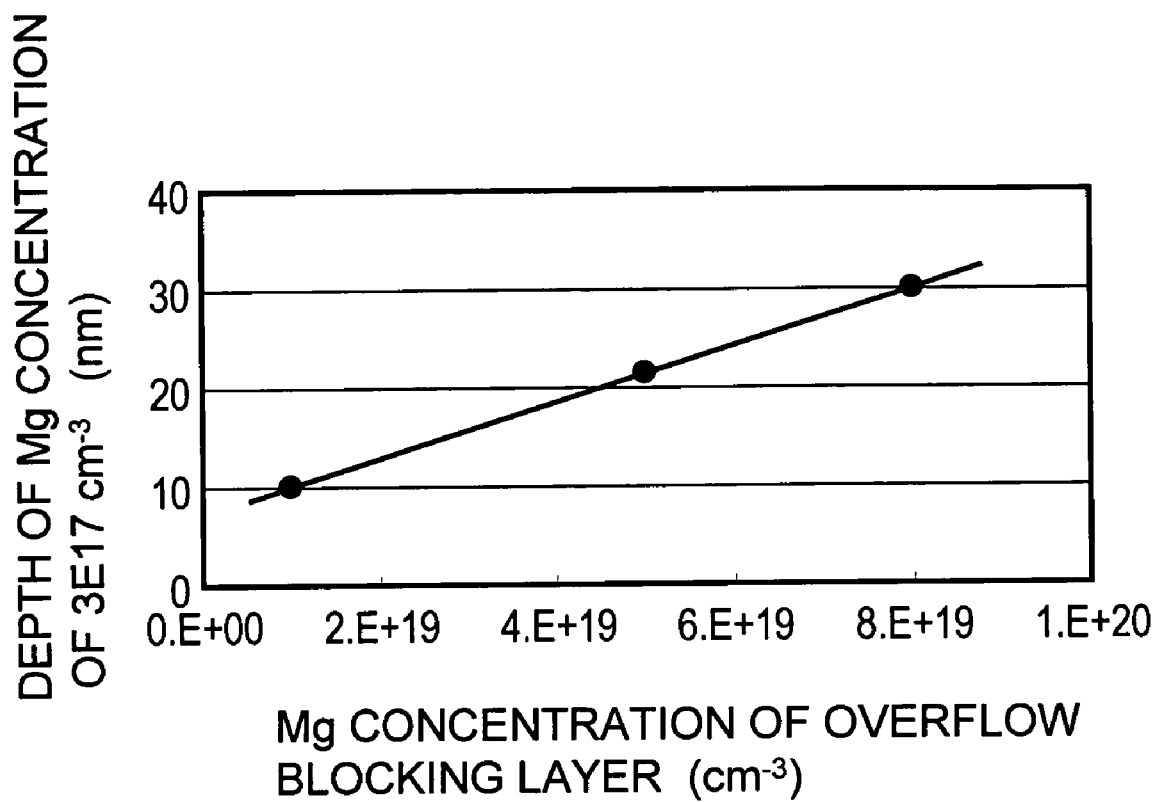
FIG. 9 is a graphical diagram showing the magnesium concentration dependence of the magnesium diffusion depth.

FIG. 9 is a graphical diagram showing the actual measurements of Mg concentration dependence of the Mg diffusion depth in the p$^+$-type overflow blocking layer 28. The vertical axis represents the depth (nm) in the diffusion region at which the Mg concentration reaches $3\times10^{17}$ cm$^{-3}$. The horizontal axis represents the Mg concentration in the p$^+$-type overflow blocking layer 28.

It can be understood that the Mg concentration of the p$^+$-type AlGaN overflow blocking layer 28 should be $8\times10^{19}$ cm$^{-3}$ or less, for example, in order to maintain the amount of Mg diffusion that does not significantly decrease the emission efficiency as revealed by the simulation result (the thickness of the region at $3\times10^{17}$ cm$^{-3}$ should be 30 nm or less).

In addition, the lower limit of the Mg concentration is preferably set to $5\times10^{18}$ cm$^{-3}$. If the concentration in the p$^+$-type AlGaN overflow blocking layer is below this limit, a barrier layer against holes occurs, which increases the operating current.

Figure 10:
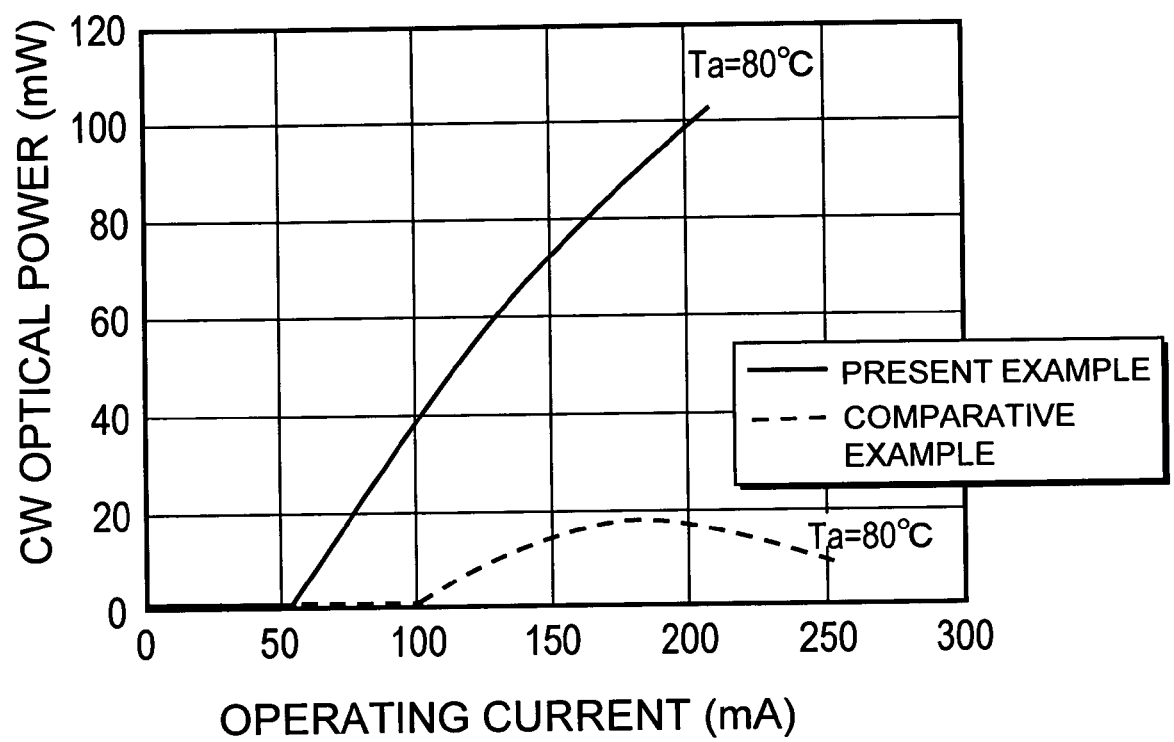
FIG. 10 is a graphical diagram showing the optical power versus current characteristics in the present example and in the comparative example.

FIG. 10 is a graphical diagram showing the actual measurements of the CW optical power versus operating current characteristics in the present example and in the comparative example (Ta=80 degrees centigrade).

Here, the Mg concentration of the p⁺-type AlGaN cladding layer 28 in the example of the invention is set to $9 \times 10^{18}$ cm⁻³. The Mg concentration of the p⁺-type AlGaN cladding layer 28 in the comparative example is set to $1.5 \times 10^{20}$ cm⁻³, which is higher than that for the present example. At an ambient temperature of Ta=80 degrees centigrade, the present example achieves a CW optical power of about 100 mW at an operating current of 200 mA. On the other hand, in the comparative example, the higher Mg concentration in the p⁺-type AlGaN cladding layer 28 increases non-emissive recombination and thus decreases the emission efficiency. As a result, the CW optical power decreases to 20 mW, which cannot meet the specifications for rewriting applications for the next-generation DVDs.

Figure 11:
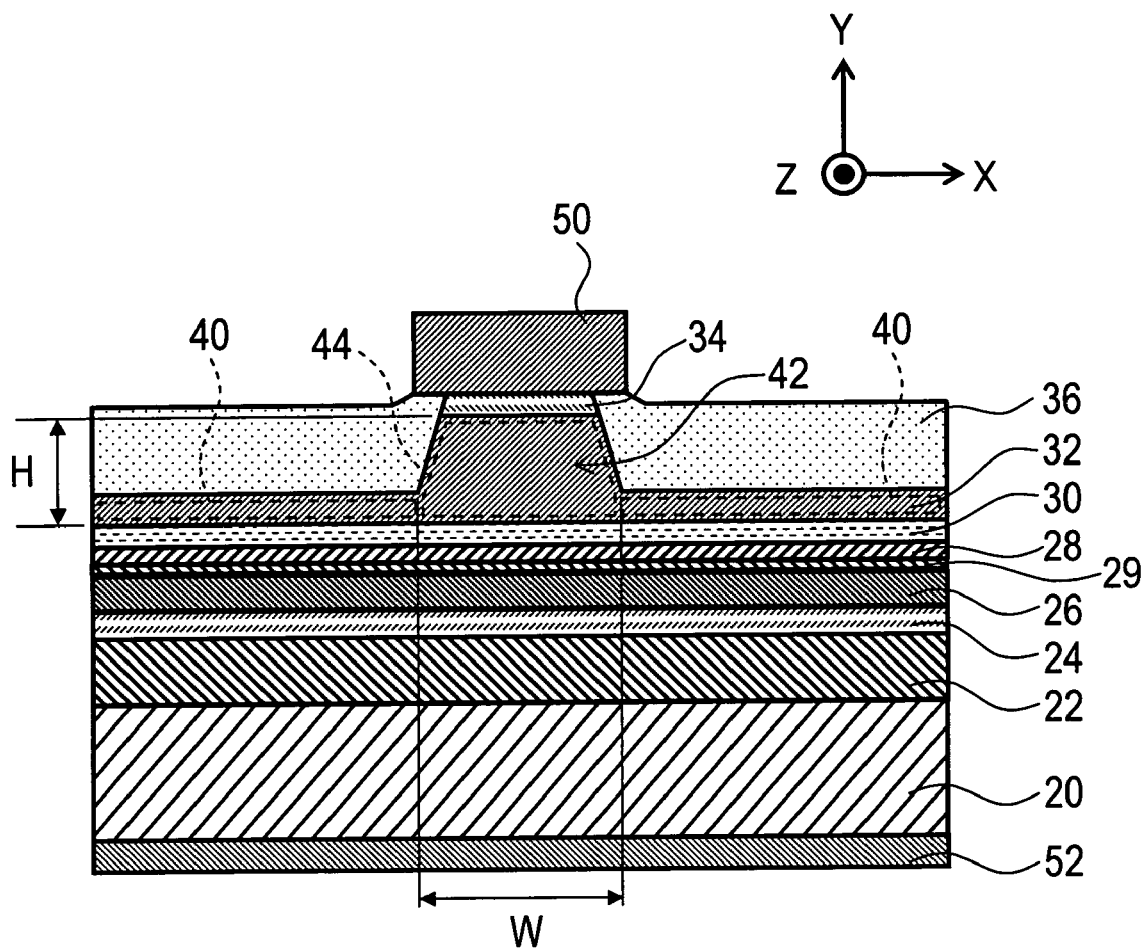
FIG. 11 is a schematic cross section of a semiconductor laser device according to a variation of the present example of the invention.

FIG. 11 is a schematic cross section of a semiconductor laser device according to a variation of the present example.

Figure 12:
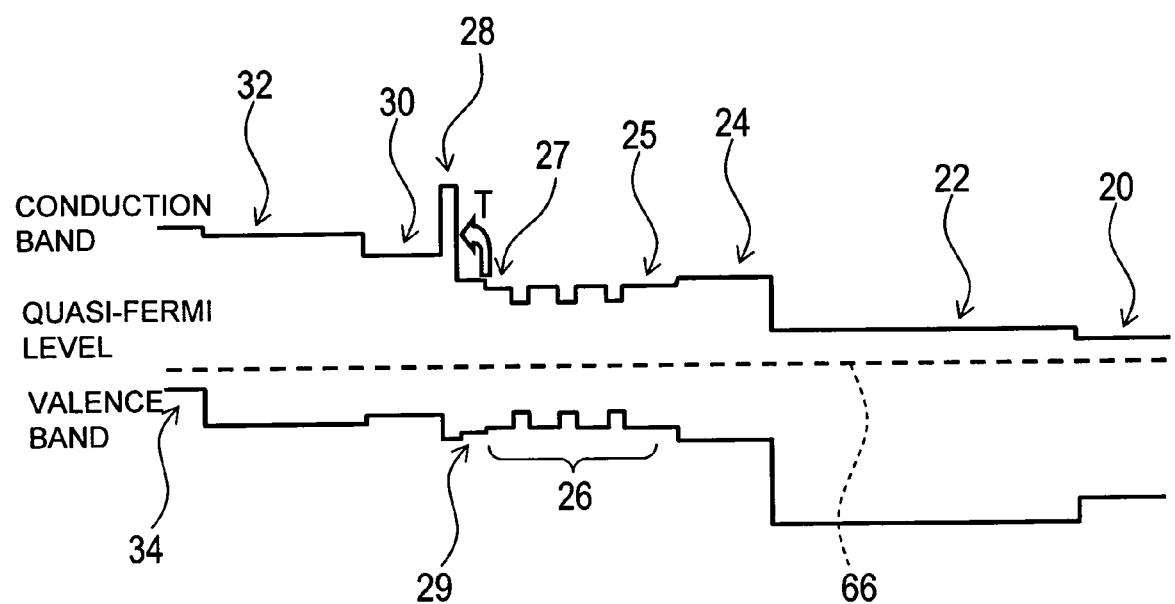
FIG. 12 is a band diagram of the semiconductor laser device according to the variation of the example of the invention.

FIG. 12 is a band diagram of the semiconductor laser device of this variation.

In this example, a diffusion prevention layer 29 is provided between the upper barrier layer 27 and the p⁺-type AlGaN overflow blocking layer 28. The diffusion prevention layer 29 is made of AlGaN with an Al composition ratio lower than that of the p⁺-type overflow blocking layer 28, or made of GaN. The thickness of the diffusion prevention layer 29 is preferably 10 nm or more and 0.1 μm or less. Mg is more likely to diffuse into the upper barrier layer 27 because the upper barrier layer 27 is typically grown at less than 1000 degrees centigrade whereas the p-type AlGaN overflow blocking layer 28 is grown at 1000 degrees centigrade or more. However, the Mg diffusion into the upper barrier layer 27 can be prevented by growing the diffusion prevention layer 29 at 1000 degrees centigrade or more.

In this example and the variation, the Mg diffusion from the p⁺-type AlGaN overflow blocking layer 28 can be blocked to reduce the thickness of the region having a Mg concentration of $3 \times 10^{17}$ cm⁻³ or more to 30 nm or less in the upper barrier layer 27. This results in preventing the formation of deep levels in the upper barrier layer 27, thereby reducing non-emissive recombination. Thus the decrease of emission efficiency can be prevented. This allows for semiconductor laser devices with improved emission efficiency for rewriting applications for the next-generation DVDs.

The above examples are described in the case where the n-type GaN substrate 20 is used. However, the invention is not limited thereto. For example, semiconductor laminated films can be formed by ELOG (Epitaxial Lateral Over Growth) on a sapphire substrate.

The foregoing is described with reference to gallium nitride based semiconductor laser devices. However, the invention is not limited thereto. For example, laser devices based on InGaAlP, InP, AlGaAs, and other compound semiconductors may be contemplated.

Embodiments of the invention have been described with reference to examples. However, the invention is not limited thereto. Any size, material, and arrangement of various elements constituting the semiconductor laser device with its ridge portion being a waveguide that are variously adapted by those skilled in the art are also encompassed within the scope of the invention as long as they include the features of the invention.

The invention claimed is:

1. A semiconductor laser device comprising:
   a first cladding layer of a first conductivity type;
   an active layer provided on the first cladding layer, the active layer having a single quantum well structure or a multiple quantum well structure of $In_xGa_{1-x}N$ ($0.05 \leq x \leq 1$) and $In_yGa_{1-y}N$ ($0 \leq y \leq 1, x > y$);
   an overflow blocking layer of a second conductivity type provided on the active layer, the over flow blocking layer being made of an $Al_tGa_{1-t}N$ ($0 < t \leq 1$) layer; and
   a second cladding layer of the second conductivity type provided on the over flow blocking layer,
   the first cladding layer including a superlattice lamination of $Al_sGa_{1-s}N$ ($0 < s \leq 0.3$, $t > s$) and GaN layer, or an $Al_sGa_{1-s}N$ ($0 < s \leq 0.3$, $t > s$) layer,
   the second cladding layer including a superlattice lamination of $Al_uGa_{1-u}N$ ($0 < u \leq 0.3$, $t > u$) and GaN layer, or an $Al_uGa_{1-u}N$ ($0 < u \leq 0.3$, $t > u$) layer, and
   the active layer including a region having an impurity concentration of $3 \times 10^{17}$ cm⁻³ or more and having a thickness of 30 nm or less between the overflow blocking layer and a well layer in the active layer closest to the overflow blocking layer.

2. A semiconductor laser device according to claim 1, wherein the overflow blocking layer contains magnesium as impurities of the second conductivity type, and the concentration of magnesium is $5 \times 10^{18}$ cm⁻³ or more.

3. A semiconductor laser device according to claim 2, wherein the concentration of magnesium is $8 \times 10^{19}$ cm⁻³ or less.

4. A semiconductor laser device according to claim 3, wherein the well layer included in the quantum well structure of the active layer has an impurity concentration of $3 \times 10^{17}$ cm⁻³ or less.

5. A semiconductor laser device according to claim 4, further comprising:
   an upper barrier layer provided adjacent to the closest well layer to the overflow blocking layer between the overflow blocking layer and the closest well layer; and
   a diffusion prevention layer provided between the upper barrier layer and the overflow blocking layer and made of GaN or $Al_uGa_{1-u}N$ ($0 \leq u \leq 1$).

6. A semiconductor laser device according to claim 3, further comprising an upper optical guide layer of a second conductivity type provided between the overflow blocking layer and the second cladding layer.

7. A semiconductor laser device according to claim 6, further comprising a lower optical guide layer of a first conductivity type provided between the active layer and the first cladding layer.

8. A semiconductor laser device according to claim 7, wherein the well layer of the quantum well structure has an impurity concentration of $3 \times 10^{17}$ cm⁻³ or less.

9. A semiconductor laser device according to claim 8, further comprising:
   an upper barrier layer provided adjacent to the closest well layer to the overflow blocking layer between the overflow blocking layer and the closest well layer; and
   a diffusion prevention layer provided between the upper barrier layer and the overflow blocking layer and made of GaN or $Al_uGa_{1-u}N$ ($0 \leq u \leq 1$).

10. A semiconductor laser device according to claim 1, further comprising:
    an upper barrier layer provided adjacent to the closest well layer to the overflow blocking layer between the overflow blocking layer and the closest well layer; and
    a diffusion prevention layer provided between the upper barrier layer and the overflow blocking layer and made of GaN or $Al_uGa_{1-u}N$ ($0 \leq u \leq 1$).

11. A semiconductor laser device according to claim 1, further comprising a GaN contact layer provided on the second cladding layer.

12. A semiconductor laser device comprising:
    a first cladding layer of a first conductivity type;

an active layer provided on the first cladding layer, the active layer having a single quantum well structure or a multiple quantum well structure of $In_xGa_{1-x}N$ ($0.05 \leq x1$) and $In_yGa_{1-y}N$ ($0 \leq y \leq 1, x > y$);

an overflow blocking layer of a second conductivity type provided on the active layer, the overflow blocking layer being made of an $Al_tGa_{1-t}N$ ($0 < t \leq 1$) layer; and a second cladding layer of a second conductivity type provided on the overflow blocking layer, the second cladding layer having a ridge portion constituting a striped waveguide and non-ridge portions adjacent to both sides of the ridge portion, the first cladding layer including a superlattice lamination of $Al_sGa_{1-s}N$ ($0 < s \leq 0.3$, $t > s$) and GaN layer, or an $Al_sGa_{1-s}N$ ($0 < s \leq 0.3$, $t > s$) layer, and the second cladding layer including a superlattice lamination of $Al_uGa_{1-u}N$ ($0 < u \leq 0.3$, $t > u$) and GaN layer, or an $Al_uGa_{1-u}N$ ($0 < u \leq 0.3$, $t > u$) layer, and the active layer including a region having an impurity concentration is $3 \times 10^{17}$ cm$^{-3}$ or more and having a thickness of 30 nm or less between the overflow blocking layer and a well layer in the active layer closest to the overflow blocking layer.

13. A semiconductor laser device according to claim 12, wherein the overflow blocking layer contains magnesium as impurities of the second conductivity type, and the concentration of magnesium is $5 \times 10^{18}$ cm$^{-3}$ or more.

14. A semiconductor laser device according to claim 13, wherein the concentration of magnesium is $8 \times 10^{19}$ cm$^{-3}$ or less.

15. A semiconductor laser device according to claim 14, wherein the well layer in the quantum well structure has an impurity concentration of $3 \times 10^{17}$ cm$^{-3}$ or less.

16. A semiconductor laser device according to claim 14, further comprising an upper optical guide layer of a second conductivity type provided between the overflow blocking layer and the second cladding layer.

17. A semiconductor laser device according to claim 16, further comprising a lower optical guide layer of a first conductivity type provided between the active layer and the first cladding layer.

18. A semiconductor laser device according to claim 12, further comprising:

an upper barrier layer provided adjacent to the closest well layer to the overflow blocking layer between the overflow blocking layer and the closest well layer; and a diffusion prevention layer provided between the upper barrier layer and the overflow blocking layer and made of GaN or $Al_uGa_{1-u}N$ ($0 \leq u \leq 1$).

19. A semiconductor laser device according to claim 12, further comprising a GaN contact layer provided on the ridge portion of the second cladding layer.

* * * * *